United States Patent
Kim et al.

(10) Patent No.: US 10,824,580 B2
(45) Date of Patent: Nov. 3, 2020

(54) SEMICONDUCTOR DEVICE

(71) Applicant: SAMSUNG ELECTRONICS CO., LTD., Suwon-si (KR)

(72) Inventors: Byung Ho Kim, Suwon-si (KR); Kwang Soo Park, Suwon-si (KR); Ji Woon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 319 days.

(21) Appl. No.: 15/815,048

(22) Filed: Nov. 16, 2017

(65) Prior Publication Data

US 2018/0165243 A1    Jun. 14, 2018

(30) Foreign Application Priority Data

Dec. 13, 2016 (KR) ........................ 10-2016-0169940

(51) Int. Cl.

| | |
|---|---|
| *G06F 12/00* | (2006.01) |
| *G06F 13/40* | (2006.01) |
| *G11C 5/02* | (2006.01) |
| *G11C 8/12* | (2006.01) |
| *G11C 7/22* | (2006.01) |
| *G11C 5/06* | (2006.01) |
| *G06F 13/42* | (2006.01) |
| *G11C 5/04* | (2006.01) |
| *G11C 11/4063* | (2006.01) |
| *G11C 7/10* | (2006.01) |
| *G06F 13/16* | (2006.01) |
| *G11C 29/02* | (2006.01) |

(52) U.S. Cl.
CPC ...... *G06F 13/4063* (2013.01); *G06F 13/1647* (2013.01); *G06F 13/4243* (2013.01); *G11C 5/025* (2013.01); *G11C 5/04* (2013.01); *G11C 5/063* (2013.01); *G11C 7/1048* (2013.01); *G11C 7/1066* (2013.01); *G11C 7/22* (2013.01); *G11C 7/222* (2013.01); *G11C 8/12* (2013.01); *G11C 11/4063* (2013.01); *G11C 29/025* (2013.01); *H05K 2201/10159* (2013.01)

(58) Field of Classification Search
USPC .......................................... 365/63
See application file for complete search history.

(56) References Cited

U.S. PATENT DOCUMENTS

| | | | |
|---|---|---|---|
| 6,144,576 A * | 11/2000 | Leddige | ........... G11O 5/04 365/51 |
| 7,095,661 B2 | 8/2006 | Osaka et al. | |
| 7,133,962 B2 | 11/2006 | Leddige et al. | |

(Continued)

OTHER PUBLICATIONS

Olney, Barry, "DDR3/4 FLY-BY vs. T-Topology Routing", The PCB Design Magazine, April 2016, pp. 38-44.

*Primary Examiner* — Min Huang
(74) *Attorney, Agent, or Firm* — F. Chau & Associates, LLC (57) ABSTRACT

A semiconductor device includes a plurality of memory chips arranged in a line on a substrate, and a bus connected to the plurality of memory chips and configured to sequentially supply an electrical signal to the plurality of memory chips in accordance with a fly-by topology. An order in which the electrical signal is supplied to the plurality of memory chips is different from an order in which the plurality of memory chips is arranged in the line on the substrate.

17 Claims, 8 Drawing Sheets

(56) References Cited

U.S. PATENT DOCUMENTS

| | | |
|---|---|---|
| 7,389,375 B2 | 6/2008 | Gower et al. |
| 8,031,504 B2 | 10/2011 | Chen |
| 8,108,607 B2 | 1/2012 | Shaeffer et al. |
| 8,134,239 B2 | 3/2012 | Hiraishi et al. |
| 8,775,991 B2 | 7/2014 | Leddige et al. |
| 8,780,655 B1 | 7/2014 | Kumar et al. |
| 9,082,464 B2 | 7/2015 | Sung et al. |
| 9,336,834 B2 | 5/2016 | Shaeffer et al. |
| 2010/0185810 A1 | 7/2010 | Cline et al. |
| 2010/0283505 A1* | 11/2010 | Koch .............. G06F 15/7867 326/41 |
| 2011/0055616 A1* | 3/2011 | Nishio ................ G11O 5/04 713/400 |
| 2013/0208524 A1 | 8/2013 | Sung et al. |
| 2013/0208818 A1 | 8/2013 | Shaeffer et al. |
| 2013/0219235 A1* | 8/2013 | Ohba ................ G11C 29/12 714/718 |
| 2013/0242680 A1* | 9/2013 | Lee ..................... G11C 7/00 365/198 |
| 2015/0019786 A1 | 1/2015 | Vaidyanath et al. |
| 2015/0206560 A1 | 7/2015 | Kang et al. |
| 2015/0255144 A1 | 9/2015 | Giovannini et al. |

\* cited by examiner

SEMICONDUCTOR DEVICE

CROSS-REFERENCE TO RELATED APPLICATION

This application claims priority under 35 U.S.C. § 119 to Korean Patent Application No. 10-2016-0169940, filed on Dec. 13, 2016 in the Korean Intellectual Property Office, the disclosure of which is incorporated by reference herein in its entirety.

TECHNICAL FIELD

Exemplary embodiments of the inventive concept relate to a semiconductor device, and in particular, to a semiconductor device in which an order or a bus path in which an electrical signal is supplied in a fly-by topology is changed to increase signal integrity.

DISCUSSION OF RELATED ART

A memory device or a storage device may include a plurality of chips, e.g., a plurality of memory chips, and a controller for controlling the plurality of chips. The plurality of chips may receive an electrical signal using a bus in accordance with a fly-by topology. The fly-by topology may collect shared signals including addresses, commands, controls, and clocks used to interface to memory devices such as dynamic random-access memory (DRAM). In a fly-by bus, a signal may connect from a source point, such as a finger at an edge of a memory module, to a first DRAM, then travels to a second DRAM, then to a third DRAM, and so on until the end of the bus is reached. A flash controller may supply an electrical signal to the plurality of chips (e.g., flash memory chips) using the bus in accordance with the fly-by topology.

SUMMARY

According to an exemplary embodiment of the inventive concept, a semiconductor device may include a plurality of memory chips arranged in a line on a substrate, and a bus connected to the plurality of memory chips and configured to sequentially supply an electrical signal to the plurality of memory chips in accordance with a fly-by topology. An order in which the electrical signal is supplied to the plurality of memory chips is different from an order in which the plurality of memory chips are arranged in the line on the substrate.

According to an exemplary embodiment of the inventive concept, a semiconductor device may include a first memory chip region including a plurality of first memory chips arranged in a line on a first surface of a substrate, a second memory chip region including a plurality of second memory chips arranged in line on a second surface of the substrate and disposed at positions corresponding to positions of the plurality of first memory chips, and a bus including a first bus and a second bus. The first bus is configured to supply an electrical signal to the first memory chip region in accordance with a fly-by topology, and the second bus is configured to supply the electrical signal to the second memory chip region in accordance with the fly-by topology. In the first memory chip region and the second memory chip region, an order in which the electrical signal is supplied to the plurality of first memory chips and the plurality of second memory chips via the first bus and the second bus, respectively, is different from an order in which the plurality of first memory chips and the plurality of second memory chips are arranged in lines.

According to an exemplary embodiment of the inventive concept, a semiconductor device includes a plurality of memory chips and a bus. The plurality of memory chips include a first memory chip, a second memory chip, and a third memory chip arranged in a line on a substrate in an order of the first memory chip, the second memory chip, and the third memory chip. The bus includes a first node at which the first memory chip is connected to the bus, a second node at which the third memory chip is connected to the bus, and a third node at which the second memory chip is connected to the bus. The bus is configured to sequentially supply an electrical signal to the plurality of memory chips in accordance with a fly-by topology. A first bus length between the first node and the second node is greater than a second bus length between the second node and the third node.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Various exemplary embodiments will now be described more fully hereinafter with reference to the accompanying drawings. Like reference numerals may refer to like elements throughout this application.

Figure 1:
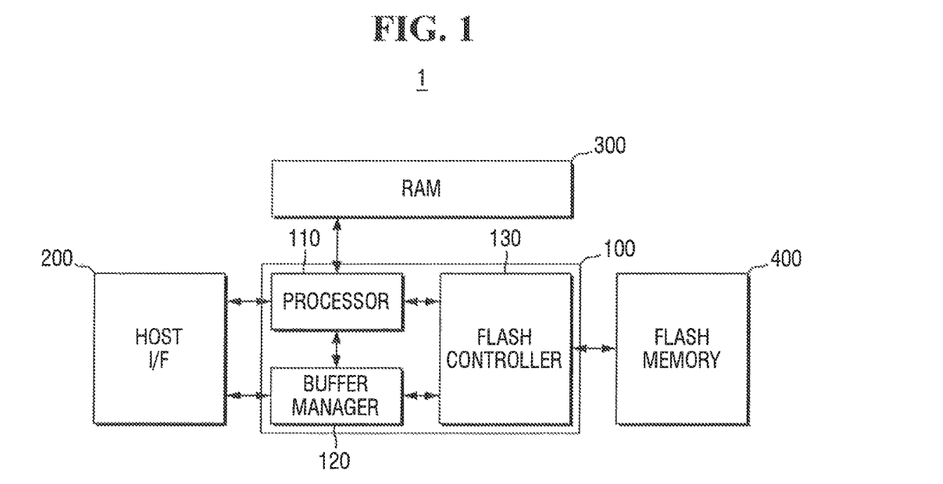
FIG. 1 is a block diagram illustrating a semiconductor system according to an exemplary embodiment of the inventive concept.

FIG. 1 is a block diagram illustrating a semiconductor system according to an exemplary embodiment of the inventive concept.

Referring to FIG. 1, a semiconductor system 1 may be, for example, a solid state drive (SSD). The semiconductor system 1 may include a SSD controller 100, a host interface logic 200, a random access memory (RAM) buffer 300, and a flash memory 400.

The SSD controller 100 may include a processor 110, a buffer manager 120, and a flash controller 130.

The processor 110 may receive a command from a host through the host interface logic 200, may process the received command, and may control the buffer manager 120 and the flash controller 130.

The host interface logic 200 may be disposed between the SSD controller 100 and the host to transmit a command, supplied from the host, to the SSD controller 100, and to transmit a response, supplied from the SSD controller 100, to the host. According to exemplary embodiments of the inventive concept, the host interface logic 200 may comply with a serial advanced technology attachment (SATA) interface standard, a peripheral component interconnect (PCI) express interface standard, or a serial attached small computer system interface (SAS) standard, but is not limited thereto.

The RAM buffer 300 may include a volatile memory including a dynamic RAM (DRAM), which is disposed around the SSD controller 100. The RAM buffer 300 may be used as a cache memory and may be used to store mapping information for data stored in the flash memory 400.

The flash memory 400 may include one or more flash memory chips. For example, the flash memory chips may be NAND flash memory chips. According to exemplary embodiments of the inventive concept, the flash memory 400 may use a plurality of channels to access the one or more flash memory chips.

According to exemplary embodiments of the inventive concept, the RAM buffer 300 may include a plurality of DRAM chips. The DRAM chips may be controlled by the processor 110 and may receive an electrical signal from the processor 110 via a bus in accordance with a fly-by topology.

According to exemplary embodiments of the inventive concept, the flash memory 400 may include the plurality of flash memory chips, as described above. The flash memory chips may be controlled by the flash controller 130 and may receive an electrical signal from the flash controller 130 via the bus in accordance with the fly-by topology.

Exemplary embodiments of the inventive concept that will be described below may be applied to a configuration of each of the RAM buffer 300 including the plurality of DRAM chips and the flash memory 400 including the plurality of flash memory chips.

The inventive concept is not be limited to the SSD shown in FIG. 1. It will be appreciated by those of ordinary skill in the art that the exemplary embodiments of the inventive concept described below may be applied to any memory structure or any storage device structure that includes a controller and a plurality of memory chips.

A controller that will be described below with reference to FIGS. 2 to 12 may represent the processor 110 for controlling the plurality of DRAM chips or the flash controller 130 for controlling the plurality of flash memory chips, but is not limited thereto. The controller according to exemplary embodiments of the inventive concept may include any controller for controlling a plurality of memory chips of any type.

Figure 2:
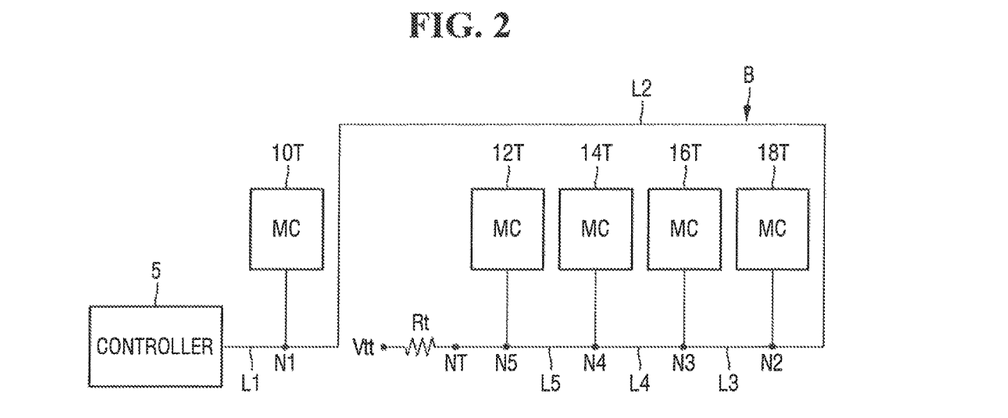
FIG. 2 is a block diagram illustrating a semiconductor device according to an exemplary embodiment of the inventive concept.

FIG. 2 is a block diagram illustrating a semiconductor device according to an exemplary embodiment of the inventive concept.

Referring to FIG. 2, a semiconductor device may include a controller 5, a plurality of memory chips 10T through 18T, and a bus B for electrically connecting components of the semiconductor device.

The controller 5 may transmit one or more electrical signals to the memory chips 10T through 18T via the bus B. According to exemplary embodiments of the inventive concept, the one or more electrical signals may include a command/address signal C/A, a control signal CTRL, and a clock signal CLK. The controller 5 may read data from the memory chips 10T through 18T and may write data in the memory chips 10T through 18T, using the one or more electrical signals.

According to exemplary embodiments of the inventive concept, the controller 5 may include the processor 110 for controlling the plurality of DRAM chips, the flash controller 130 for controlling the plurality of flash memory chips, or any controller for controlling a plurality of memory chips of any type, as described above with reference to FIG. 1.

The memory chips 10T through 18T may be arranged in a line on a substrate and may include a first memory chip 10T, a second memory chip 12T, a third memory chip 14T, a fourth memory chip 16T, and a fifth memory chip 18T. The first memory chip 10T may be a memory chip that is disposed at a forward-most position among the memory chips 10T through 18T arranged in a line with respect to the controller 5. The fifth memory chip 18T may be the memory chip that is disposed at a rearward-most position among the memory chips 10T through 18T arranged in the line with respect to the controller 5. The second through fourth memory chips 12T, 14T, and 16T may be arranged in the order shown in FIG. 2 between the first memory chip 10T and the fifth memory chip 18T.

The bus B may be connected to the controller 5 and the memory chips 10T through 18T to supply an electrical signal in sequence to the memory chips 10T through 18T in accordance with a fly-by topology. For example, the bus B may sequentially supply the command/address signal C/A output from the controller 5 to the memory chips 10T through 18T. The bus B may sequentially supply the clock signal CLK output from the controller 5 to the memory chips 10T through 18T.

The bus B may include a plurality of nodes N1 through N5 and NT, e.g., a first node N1, a second node N2, a third node N3, a fourth node N4, a fifth node N5, and an end node NT. The first node N1 may be connected to the first memory chip 10T, the second node N2 may be connected to the fifth memory chip 18T, the third node N3 may be connected to the fourth memory chip 16T, the fourth node N4 may be connected to the third memory chip 14T, and the fifth node N5 may be connected to the second memory chip 12T. The end node NT may be serve as an end node of the bus B and may be connected to a termination resistor Rt to reduce or prevent signal distortion caused by impedance mismatching of signals transmitted between the controller 5 and the nodes N1 through N5 and NT. In this case, one terminal of the termination resistor Rt may be connected to the end node NT and the other terminal thereof may be connected to a termination voltage Vtt.

In the bus architecture in accordance with the fly-by topology, due to reflection between the first memory chip 10T and the second memory chip 12T corresponding to a front portion of the bus B, the distortion of the transmitted signal may increase and a ring-back phenomenon may occur.

According to exemplary embodiments of the inventive concept, to secure a ring-back margin and increase signal integrity, the first memory chip 10T and the second memory chip 12T may be physically disposed so that a distance between the first memory chip 10T and the second memory chip 12T is made greater than a distance between the second memory chip 12T and the third memory chip 14T.

However, such a structure may increase an area of the substrate, and thus the memory device or the storage device may not remain relatively small. According to exemplary embodiments of the inventive concept, even without increasing a physical distance between the memory chips, the ring-back margin may be secured and signal integrity may be increased, by changing an order or a bus path receiving the electrical signal in accordance with the fly-by topology.

Referring again to FIG. 2, the order in which the bus B supplies the electrical signal to the memory chips 10T through 18T may be different from the sequential order in which the memory chips 10T through 18T are arranged in a line on the substrate with respect to the controller 5.

After supplying the electrical signal to the first memory chip 10T at the first node N1, the bus B may supply the electrical signal to the fifth memory chip 18T at the second node N2 before supplying the electrical signal to the second memory chip 12T at the fifth node N5. Herein, the second memory chip 12T may be connected to the end node NT of the bus B coupled to the termination resistor Rt.

For example, after supplying the electrical signal to the first memory chip 10T at the first node N1, the bus B may supply the electrical signal to the fifth memory chip 18T at the second node N2. Then, after supplying the electrical signal to the fourth memory chip 16T and the third memory chip 14T at the third node N3 and the fourth node N4, respectively, the electrical signal may be finally supplied to the second memory chip 12T at the fifth node N5.

A bus length L2 between the first node N1 and the second node N2 may be greater than a bus length L3 between the second node N2 and the third node N3 corresponding to the fifth memory chip 18T and the fourth memory chip 16T, respectively. Likewise, the bus length L2 may be greater than a bus length L4 between the third node N3 and the fourth node N4 or a bus length L5 between the fourth node N4 and the fifth node N5. Furthermore, there is a bus length L1 between the controller 5 and the first node N1 (e.g., the first memory chip 10T).

The bus lengths L3, L4, and L5 may be equal or not.

The order in which the bus B supplies the electrical signal to the memory chips 10T through 18T differs from the order in which the memory chips 10T through 18T are arranged in a line on the substrate, and thus, the bus length may be extended even without increasing the physical distance between the first memory chip 10T and the second memory chip 12T. Accordingly, the ring-back margin may be secured and the signal integrity may be increased while maintaining downsizing of the memory device or the storage device.

Figure 3:
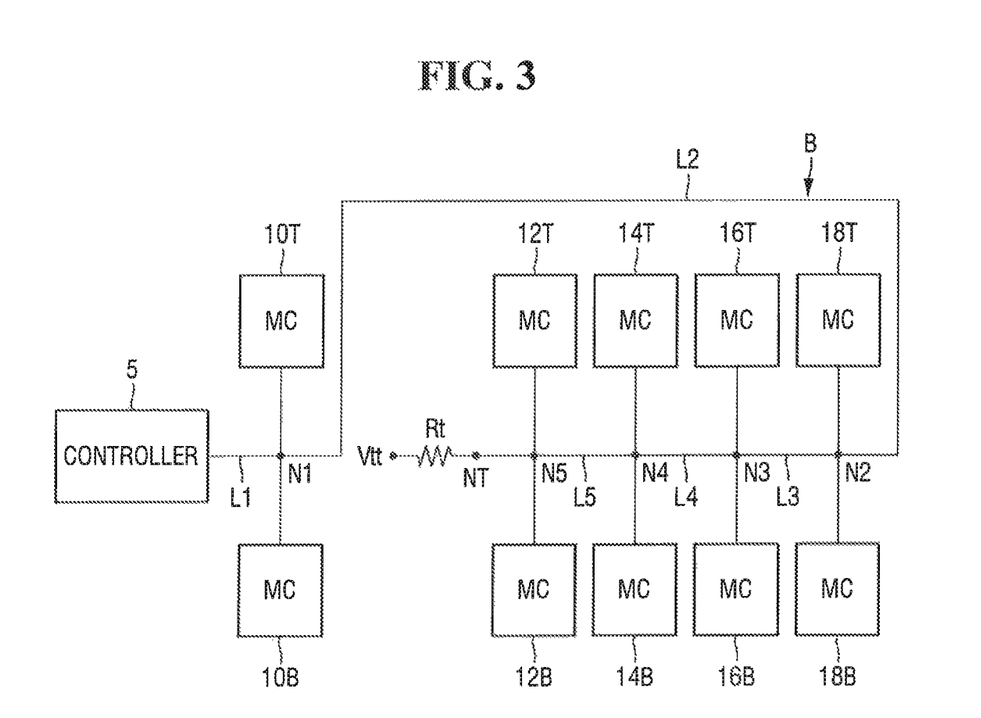
FIG. 3 is a block diagram illustrating a semiconductor device according to an exemplary embodiment of the inventive concept.

FIG. 3 is a block diagram illustrating a semiconductor device according to an exemplary embodiment of the inventive concept.

Referring to FIG. 3, a semiconductor device may include the controller 5, the plurality of memory chips 10T through 18T, a plurality of memory chips 10B through 18B, and the bus B for electrically connecting components of the semiconductor device.

The controller 5 may supply one or more electrical signals to the memory chips 10T through 18T and 10B through 18B, and thus, data may be read from or written in the memory chips 10T through 18T and 10B through 18B.

The memory chips 10T through 18T may be arranged in a line on an upper surface of a substrate. For example, the memory chips 10T through 18T may form a first memory chip group and may include the first memory chip 10T, the second memory chip 12T, the third memory chip 14T, the fourth memory chip 16T, and the fifth memory chip 18T. With respect to the controller 5, the first memory chip 10T may be disposed at a forward-most position among the memory chips 10T through 18T arranged in a line, and the fifth memory chip 18T may be disposed at a rearward-most position among the memory chips 10T through 18T arranged in the line. The second through fourth memory chips 12T, 14T, and 16T may be arranged in the arrangement order shown in FIG. 2 between the first memory chip 10T and the fifth memory chip 18T.

The memory chips 10B through 18B may be arranged in a line on a lower surface of the substrate. For example, the memory chips 10B through 18B may form a second memory chip group and may include a first memory chip 10B, a second memory chip 12B, a third memory chip 14B, a fourth memory chip 16B, and a fifth memory chip 18B which are sequentially arranged in a line with respect to the controller 5. The memory chips 10B through 18B of the second memory chip group may be placed on the lower surface of the substrate at positions corresponding to positions of the memory chips 10T through 18T, respectively, of the first memory chip group on the upper surface of the substrate. For example, the position of the first memory chip 10B may correspond to the position of the first memory chip 10T, the position of the second memory chip 12B may correspond to the position of the second memory chip 12T, the position of the third memory chip 14B may correspond to the position of the third memory chip 14T, the position of the fourth memory chip 16B may correspond to the position of the fourth memory chip 16T, and the position of the fifth memory chip 18B may correspond to the position of the fifth memory chip 18T.

The bus B may connect the controller 5 to the memory chips 10T through 18T and 10B through 18B, and may sequentially supply the electrical signal to the memory chips 10T through 18T and 10B through 18B in accordance with a fly-by topology. The bus B may include the first node N1, the second node N2, the third node N3, the fourth node N4, the fifth node N5, and the end node NT.

After the bus B supplies the electrical signal to the first memory chips 10T and 10B at the first node N1, the bus B may supply the electrical signal to the fifth memory chips 18T and 18B at the second node N2 before supplying the electrical signal to the second memory chips 12T and 12B at the fifth node N5. The second memory chip 12T of the first memory chip group and the second memory chip 12B of the second memory chip group may each be connected to the end node NT of the bus B which is connected to the termination resistor Rt.

The bus length L2 between the first node N1 and the second node N2 may be greater than the bus length L3 between the second node N2 and the third node N3 corresponding to the fifth memory chips 18T and 18B and the fourth memory chips 16T and 16B, respectively. Likewise, the bus length L2 may be greater than the bus length L4 between the third node N3 and the fourth node N4 or the bus length L5 between the fourth node N4 and the fifth node N5.

The bus lengths L3, L4, and L5 may be equal or not.

The order in which the bus B supplies the electrical signal to the memory chips 10T through 18T and 10B through 18b of the first and second memory chip groups differs from the order in which the memory chips 10T through 18T and 10B through 18b are arranged in a line on the substrate, and thus, the bus length may be extended even without increasing a physical distance between the first memory chips 10T and 10B and the second memory chips 12T and 12B. Accordingly, a ring-back margin may be secured and signal integrity may be increased while maintaining downsizing of the memory device or the storage device.

Figure 4:
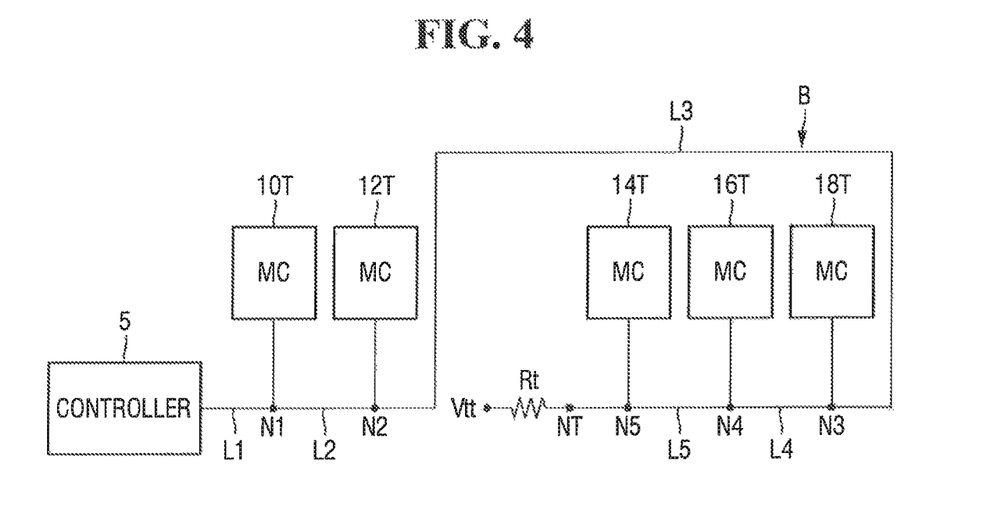
FIG. 4 is a block diagram illustrating a semiconductor device according to an exemplary embodiment of the inventive concept.

FIG. 4 is a block diagram illustrating a semiconductor device according to an exemplary embodiment of the inventive concept.

Referring to FIG. 4, a semiconductor device may include the controller 5, the plurality of memory chips 10T through 18T, and the bus B for electrically connecting components of the semiconductor device. The memory chips 10T through 18T may include the first memory chip 10T, the second memory chip 12T, the third memory chip 14T, the fourth memory chip 16T, and the fifth memory chip 18T that are sequentially arranged in a line on a substrate with respect to the controller 5. The bus B may include the first node N1, the second node N2, the third node N3, the fourth node N4, the fifth node N5, and the end node NT.

In FIG. 2, to secure the ring-back margin and increase signal integrity, the bus length between the first memory chip 10T and the second memory chip 12T may be greater than the bus length between the other adjacent memory chips, e.g., the bus length between the second memory chip 12T and the third memory chip 14T.

Unlike FIG. 2, in the present exemplary embodiment of FIG. 4, to secure the ring-back margin and increase signal integrity, a bus length between the second memory chip 12T and the third memory chip 14T may be made greater than a bus length between the other adjacent memory chips, e.g., a bus length between the first memory chip 10T and the second memory chip 12T or a bus length between the third memory chip 14T and the fourth memory chip 16T.

After the bus B supplies an electrical signal to the first memory chip 10T and the second memory chip 12T at the first node N1 and the second node N2, respectively, the bus B may supply the electrical signal to the fifth memory chip 18T at the third node N3 before supplying the electrical signal to the third memory chip 14T at the fifth node N5. The third memory chip 14T may be connected to the end node NT of the bus B which is connected to the termination resistor Rt.

The bus length L3 between the second node N2 and the third node N3 may be greater than the bus length L2 between the first node N1 and the second node N2, the bus length L4 between the third node N3 and the fourth node N4, or the bus length L5 between the fourth node N4 and the fifth node N5.

In a bus architecture in accordance with a fly-by topology, signal distortion between the first memory chip 10T and the second memory chip 12T corresponding to a front portion of the bus B may be the largest. The signal distortion may also be present between the second memory chip 12T and the third memory chip 14T.

Thus, in the present exemplary embodiment, the signal integrity may be increased by extending the bus length between any two adjacent memory chips even without extending the bus length between the first memory chip 10T and the second memory chip 12T.

The order in which the bus B supplies the electrical signal to the memory chips 10T through 18T differs from the order in which the memory chips 10T through 18T are arranged in a line on the substrate, and thus, the bus length may be extended even without increasing a physical distance between the second memory chips 12T and the third memory chip 14T. Accordingly, the ring-back margin may be secured and the signal integrity may be increased while maintaining downsizing of the memory device or the storage device.

As shown in FIG. 4, the bus length between the second memory chip 12T and the third memory chip 14T may be extended. However, the inventive concept is not limited thereto. For example, the bus length between the third memory chip 14T and the fourth memory chip 16T may be extended.

Figure 5:
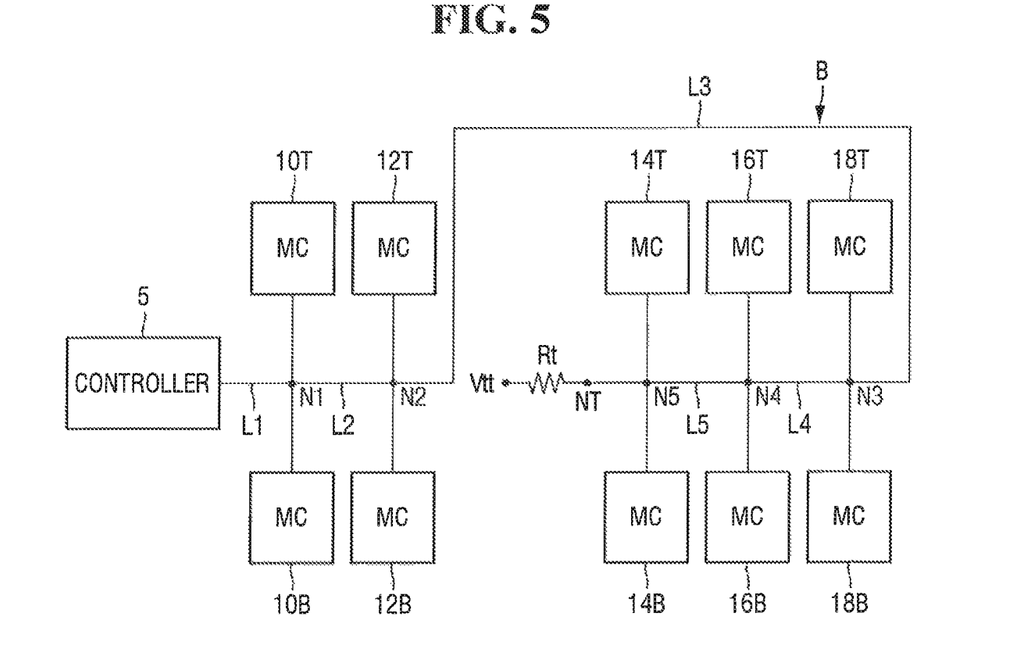
FIG. 5 is a block diagram illustrating a semiconductor device according to an exemplary embodiment of the inventive concept.

FIG. 5 is a block diagram illustrating a semiconductor device according to an exemplary embodiment of the inventive concept.

Referring to FIG. 5, a semiconductor device may include the controller 5, the plurality of memory chips 10T through 18T and 10B through 18B, and the bus B for electrically connecting components of the semiconductor device.

In a similar manner as described in FIG. 3, the memory chips 10T through 18T may be arranged in a line on an upper surface of a substrate, and the memory chips 10B through 18B may be arranged in a line on a lower surface of a substrate. The memory chips 10T through 18T of the first memory chip group on the upper surface of the substrate may be placed at positions corresponding to positions of the memory chips 10B through 18B of the second memory chip group on the lower surface of the substrate.

The bus B may connect the controller 5 to the memory chips 10T through 18T and 10B through 18B of the first and second memory chip groups to sequentially supply an electrical signal to the memory chips 10T through 18T and 10B through 18B in accordance with a fly-by topology. The bus B may include the first node N1, the second node N2, the third node N3, the fourth node N4, the fifth node N5, and the end node NT.

After the bus B supplies the electrical signal to the first memory chips 10T and 10B and the second memory chips 12T and 12B at the first node N1 and the second node N2, respectively, the bus B may supply the electrical signal to the fifth memory chips 18T and 18B at the third node N3 before supplying the electrical signal to the third memory chips 14T and 14B at the fifth node N5. The third memory chips 14T and 14B may be connected to the end node NT of the bus B which is connected to the termination resistor Rt.

The bus length L3 between the second node N2 and the third node N3 may be greater than the bus length L2 between the first node N1 and the second node N2, the bus length L4 between the third node N3 and the fourth node N4, or the bus length L5 between the fourth node N4 and the fifth node N5.

The order in which the bus B supplies the electrical signal to the memory chips 10T through 18T and 10B through 18B of the first and second memory chip groups differs from the order in which the memory chips 10T through 18T and 10B through 18B are arranged in a line on the substrate, and thus, the bus length may be extended even without increasing the physical distance between the second memory chips 12T and 12B and the third memory chips 14T and 14B. Accordingly, a ring-back margin may be secured and signal integrity may be increased while maintaining downsizing of the memory device or the storage device.

As shown in FIG. 5, the bus length between the second memory chips 12T and 12B and the third memory chips 14T and 14B may be extended. However, the inventive concept is not limited thereto. For example, the bus length between any adjacent memory chips, e.g., the bus length between the third memory chips 14T and 14B and the fourth memory chips 16T and 16B, may be extended to increase signal integrity.

Figure 6:
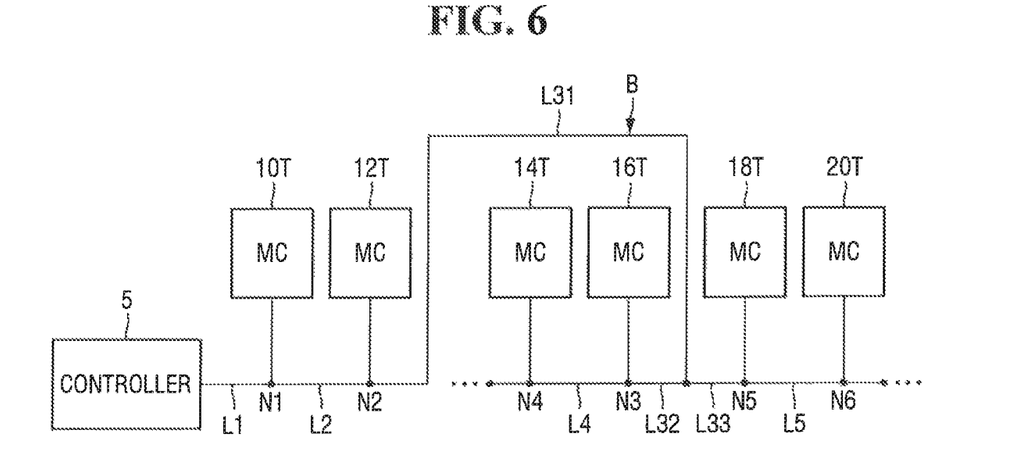
FIG. 6 is a block diagram illustrating a semiconductor device according to an exemplary embodiment of the inventive concept.

FIG. 6 is a block diagram illustrating a semiconductor device according to an exemplary embodiment of the inventive concept.

Referring to FIG. 6, a semiconductor device may include the controller 5, the plurality of memory chips 10T through 20T, and the bus B for electrically connecting components of the semiconductor device. The memory chips 10T through 20T may include the first memory chip 10T, the second memory chip 12T, the third memory chip 14T, the fourth memory chip 16T, the fifth memory chip 18T, and a sixth memory chip 20T that are sequentially arranged in a line on a substrate with respect to the controller 5.

In FIGS. 2 and 4, to secure the ring-back margin and increase the signal integrity, the bus length between any two adjacent memory chips (e.g., the bus length between the first memory chip 10T and the second memory chip 12T or the bus length between the second memory chip 12T and the third memory chip 14T) may be greater than the bus length between the other adjacent memory chips.

In the present exemplary embodiment of FIG. 6, the bus B may be implemented to be branched. The bus B may include the first node N1, the second node N2, the third node N3, the fourth node N4, the fifth node N5, and a sixth node N6.

After the bus B supplies an electrical signal to the first memory chip 10T and the second memory chip 12T at the first node N1 and the second node N2, respectively, the bus B may supply the electrical signal to the fourth memory chip 16T and the fifth memory chip 18T at the third node N3 and the fifth node N5, respectively, before supplying the electrical signal to the third memory chip 14T at the fourth node N4 and the sixth memory chip 20T at the sixth node N6.

A sum of a bus length L31 and a bus length L32, which is the bus length between the second node N2 and the third node N3, may be greater than the bus length L2 between the first node N1 and the second node N2 or the bus length L4 between the third node N3 and the fourth node N4. Additionally, a sum of the bus length L31 and a bus length L33, which is the bus length between the second node N2 and the fifth node N5, may be greater than the bus length L2 or a bus length L5 between the fifth node N5 and the sixth node N6.

The order in which the bus B supplies the electrical signal to the memory chips 10T through 20T differs from the order in which the memory chips 10T through 20T are arranged in a line on the substrate, and thus, the bus length may be extended even without increasing a physical distance between the second memory chip 12T and the third memory chip 14T. Accordingly, the ring-back margin may be secured and signal integrity may be increased while maintaining downsizing of the memory device or the storage device.

As shown in FIG. 6, the bus length between the second memory chip 12T and the third memory chip 14T may be extended. However, the inventive concept is not limited thereto. For example, to increase signal integrity, the bus length between any two adjacent memory chips (e.g., the bus length between the first memory chip 10T and the second memory chip 12T or the bus length between the third memory chip 14T and the fourth memory chip 16T) may be extended.

Figure 7:
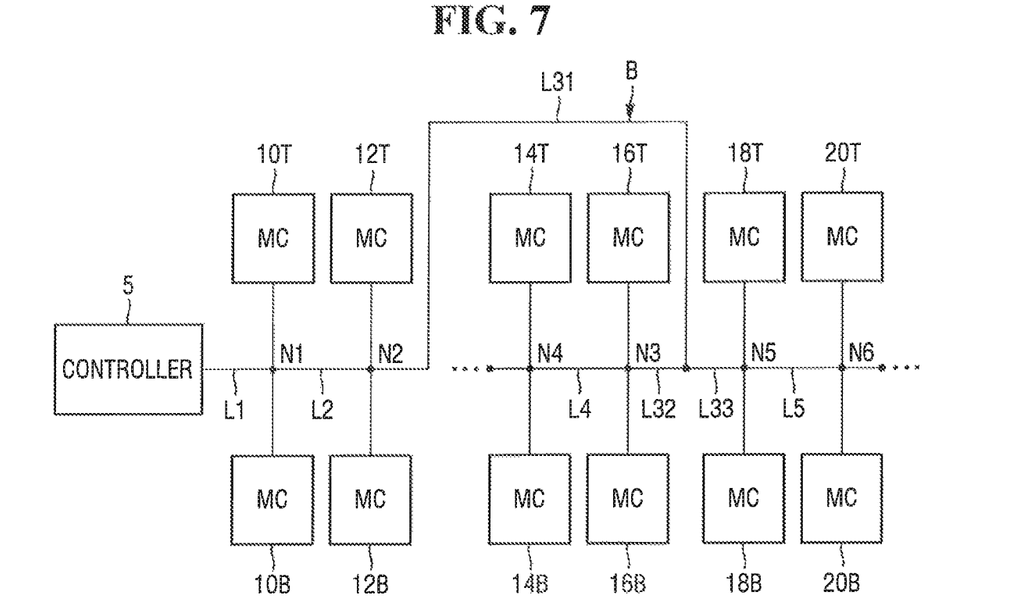
FIG. 7 is a block diagram illustrating a semiconductor device according to an exemplary embodiment of the inventive concept.

FIG. 7 is a block diagram illustrating a semiconductor device according to an exemplary embodiment of the inventive concept.

Referring to FIG. 7, a semiconductor device may include the controller 5, the plurality of memory chips 10T through 20T, a plurality of memory chips 10B through 20B, and the bus B for electrically connecting components of the semiconductor device.

In a similar manner as described with reference to FIG. 3, the memory chips 10T through 20T may be arranged in a line on an upper surface of a substrate, and the memory chips 10B through 20B may be arranged in a line on a lower surface of the substrate. The memory chips 10T through 20T may form the first memory chip group and may include the first memory chip 10T, the second memory chip 12T, the third memory chip 14T, the fourth memory chip 16T, the fifth memory chip 18T, and the sixth memory chip 20T that are sequentially arranged in a line with respect to the controller 5. The memory chips 10B through 20B may form the second memory chip group and may include the first memory chip 10B, the second memory chip 12B, the third memory chip 14B, the fourth memory chip 16B, the fifth memory chip 18B, and a sixth memory chip 20B that are sequentially arranged in a line with respect to the controller 5.

The memory chips 10T through 20T of the first memory chip group on the upper surface of the substrate may be placed at positions corresponding to positions of the memory chips 10B through 20B, respectively, of the second memory chip group on the lower surface of the substrate.

The bus B may connect the controller 5 to the memory chips 10T through 20T and 10B through 20B of the first and second memory chip groups and may sequentially supply an electrical signal to the memory chips 10T through 20T and 10B through 20B in accordance with a fly-by topology. The bus B may include the first node N1, the second node N2, the third node N3, the fourth node N4, the fifth node N5, and the sixth node N6.

After the bus B supplies the electrical signal to the first memory chips 10T and 10B and the second memory chips 12T and 12B at the first node N1 and the second node N2, respectively, the bus B may supply the electrical signal to the fourth memory chips 16T and 16B and the fifth memory chips 18T and 18B at the third node N3 and the fifth node N5, respectively, before supplying the electrical signal to the third memory chips 14T and 14B at the fourth node N4 and the sixth memory chips 20T and 20B at the sixth node N6.

A sum of the bus length L31 and the bus length L32, which is the bus length between the second node N2 and the third node N3, may be greater than the bus length L2 between the first node N1 and the second node N2 or the bus length L4 between the third node N3 and the fourth node N4. Additionally, a sum of the bus length L31 and the bus length L33, which is the bus length between the second node N2 and the fifth node N5, may be greater than the bus length L2 or the bus length L5 between the fifth node N5 and the sixth node N6.

The order in which the bus B supplies the electrical signal to the memory chips 10T through 20T and 10B through 20B of the first and second memory chip groups differs from the order in which the memory chips 10T through 20T and 10B through 20B are arranged in a line on the substrate, and thus, the bus length may be extended even without increasing a physical distance between the second memory chips 12T and 12B and the third memory chips 14T and 14B. Accordingly, a ring-back margin may be secured and signal integrity may be increased while maintaining downsizing of the memory device or the storage device.

As shown in FIG. 7, the bus length between the second memory chips 12T and 12B and the third memory chips 14T and 14B may be extended. However, the inventive concept is not limited thereto. For example, to increase signal integrity, the bus length between any adjacent memory chips (e.g., the bus length between the first memory chips 10T and 10B and the second memory chips 12T and 12B or the bus length between the third memory chips 14T and 14B and the fourth memory chips 16T and 16B) may be extended.

Figure 8:
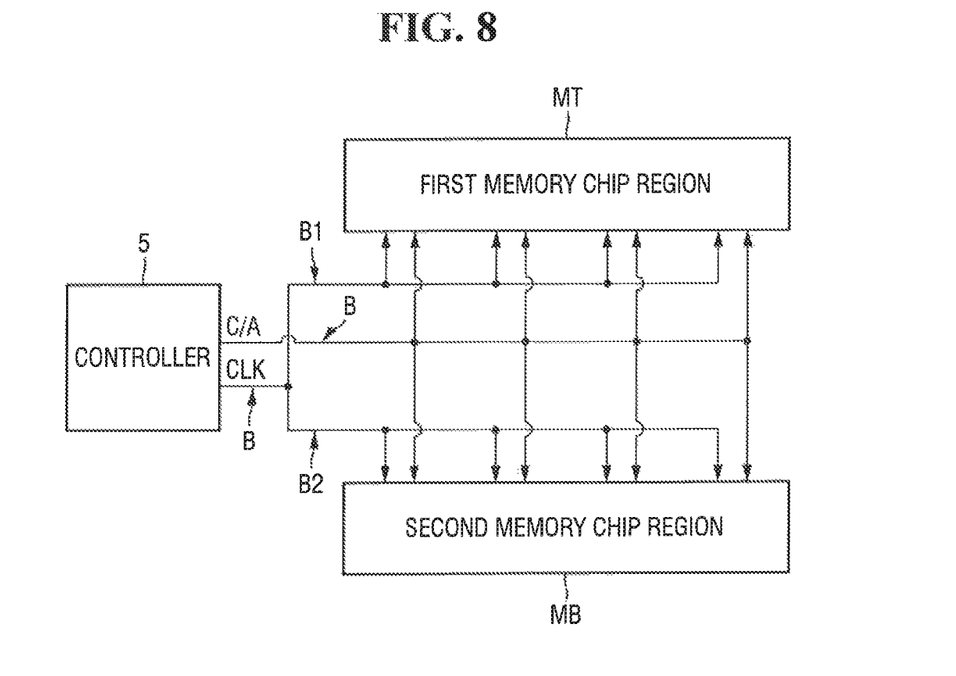
FIG. 8 is a block diagram illustrating a semiconductor device according to an exemplary embodiment of the inventive concept.

FIG. 8 is a block diagram illustrating a semiconductor device according to an exemplary embodiment of the inventive concept.

Referring to FIG. 8, a semiconductor device may include the controller 5, a first memory chip region MT including a plurality of memory chips, a second memory chip region MB including a plurality of memory chips, and the bus B for electrically connecting the controller 5 and the memory chips to one another.

The first memory chip region MT may include the memory chips which are arranged in a line on an upper surface of a substrate. The memory chips in the first memory chip region MT may have the arrangement as described above with reference to FIGS. 2 to 7.

The second memory chip region MB may include the memory chips which are arranged in a line on a lower surface of the substrate and may be placed at positions corresponding to positions of the memory chips arranged in the first memory chip region MT. The memory chips in the second memory chip region MB may also have the arrangement as described above with reference to FIGS. 2 to 7.

The bus B may include a first bus B1 for supplying an electrical signal to the first memory chip region MT in accordance with a fly-by topology and a second bus B2 for supplying the electrical signal to the second memory chip region MB in accordance with the fly-by topology.

According to exemplary embodiments of the inventive concept, when the electrical signal is the clock signal CLK output from the controller 5, the first bus B1 and the second bus B2 may be implemented as separate buses which are different from each other. According to exemplary embodiments of the inventive concept, when the electrical signal is the command/address signal C/A, the first bus B1 and the second bus B2 may be implemented as one bus which is physically the same.

When the electrical signal is the clock signal CLK, the bus B may include the first bus B1 branched to supply the electrical signal to the first memory chip region MT and the second bus B2 branched to supply the electrical signal to the second memory chip region MB.

A speed of the clock signal CLK may be higher than a speed of the command/address signal C/A. For example, the speed of the clock signal CLK may be about two times the speed of the command/address signal C/A. In this case, signal integrity of the clock signal CLK having a higher speed may be worse than signal integrity of the command/address signal C/A.

To reduce the effect of the above phenomenon, a strobe signal such as the clock signal CLK may be transmitted to the first memory chip region MT and the second memory chip region MB via the separate first and second buses B1 and B2 that are branched from the bus B, and a data/address signal such as the command/address signal C/A may be transmitted to the first memory chip region MT and the second memory chip MB via one bus B without branching.

The signal integrity of the clock signal CLK having the higher speed may be increased by reducing an instantaneous load on a strobe signal such as the clock signal CLK compared to an instantaneous load on a data/address signal such as the command/address signal C/A having a lower speed.

For example, when the speed of the clock signal CLK is about twice the speed of the command/address signal C/A, the bus B for transmitting the clock signal CLK may be branched into the first bus B1 for supplying the electrical signal to the first memory chip region MT and the second bus B for supplying the electrical signal to the second memory chip region MB such that the instantaneous load on the clock signal CLK may be reduced to half of the instantaneous load on the command/address signal C/A. Thus, the signal integrity of the clock signal CLK having the higher speed may be increased.

Figure 9:
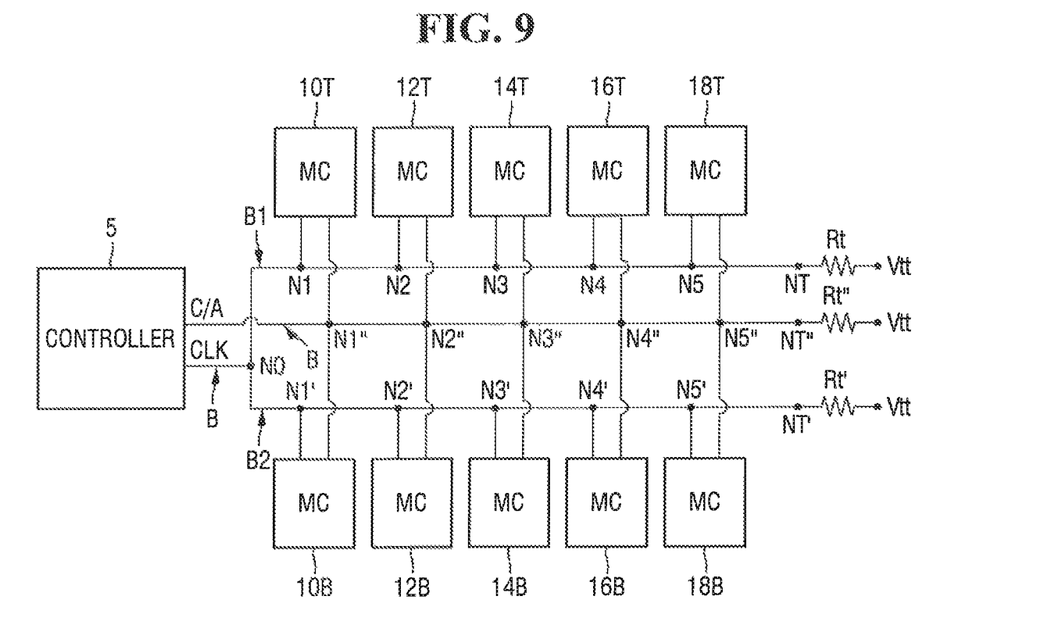
FIG. 9 is a block diagram illustrating a semiconductor device according to an exemplary embodiment of the inventive concept.

FIG. 9 is a block diagram illustrating a semiconductor device according to an exemplary embodiment of the inventive concept.

Referring to FIG. 9, a semiconductor device may include the controller 5, the plurality of memory chips 10T through 18T and 10B through 18B, and the bus B for electrically connecting components of the semiconductor device. The memory chips 10T through 18T may form the first memory chip group. The memory chips 10B through 18B may form the second memory chip group. The memory chips 10T through 18T of the first memory group may be sequentially arranged in a line on an upper surface of a substrate with respect to the controller 5. The memory chips 10B through 18B of the second memory group may be sequentially arranged in a line on a lower surface of the substrate with respect to the controller 5.

The bus B for transmitting the clock signal CLK output from the controller 5 may include the first bus B1 and the second bus B2 that are branched at an output node NO of the controller 5. The first bus B1 may include a first node group including the first node N1, the second node N2, the third node N3, the fourth node N4, the fifth node N5, and the end node NT. The second bus B2 may include a second node group including a first node N1', a second node N2', a third node N3', a fourth node N4', a fifth node N5', and an end node NT'.

The bus B for transmitting the clock signal CLK output from the controller 5 may transmit the clock signal CLK to the memory chips 10T through 18T of the first memory chip group and the memory chips 10B and 18B of the second chip group via the first bus B1 and the second bus B2, respectively. The first bus B1 may transmit the clock signal CLK to the memory chips 10T and 18T of the first memory chip group via the first through fifth nodes N1 through N5 of the first node group. The second bus B2 may transmit the clock signal CLK to the memory chips 10B and 18B of the second memory chip group via the first through fifth nodes N1' through N5' of the second node group.

The bus B for transmitting the command/address signal C/A output from the controller 5 may transmit the command/address signal C/A to the memory chips 10T and 18T of the first memory chip group and the memory chips 10B and 18B of the second memory chip group. The bus B for transmitting the command/address signal C/A output from the controller 5 may be one bus without branching and may include a third node group including a first node N1", a second node N2", a third node N3", a fourth node N4", a fifth node N5", and an end node NT". For example, the bus B for transmitting the command/address signal C/A may transmit the command/address signal to the memory chips 10T through 18T and 10B through 18B of the first and second memory chip groups via the first through fifth nodes N1" through N5" of the third node group.

In this case, a first termination resistor Rt may be connected to the end node NT of the first bus B1 for transmitting the clock signal CLK, and a second termination resistor Rt' may be connected to the end node NT' of the second bus B2 for transmitting the clock signal CLK. A third termination resistor Rt" may be connected to the end node NT" of the bus B for transmitting the command/address signal C/A.

Figure 10:
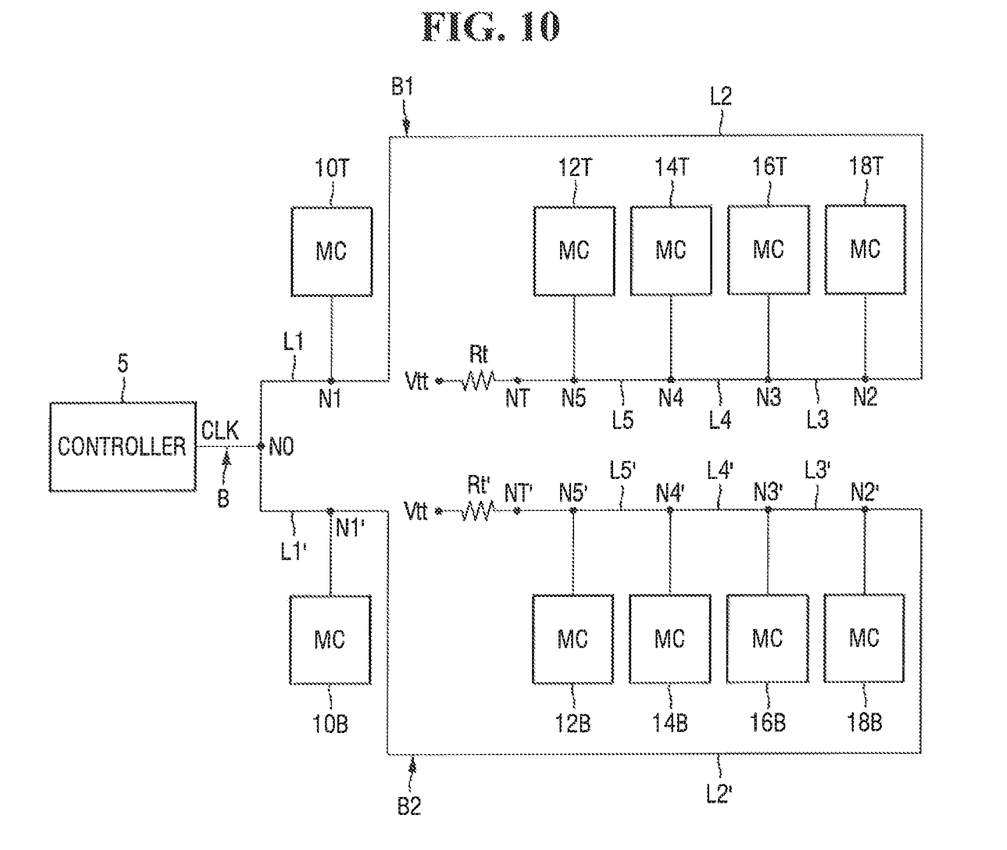
FIG. 10 is a block diagram illustrating a semiconductor device according to an exemplary embodiment of the inventive concept.

FIG. 10 is a block diagram illustrating a semiconductor device according to an exemplary embodiment of the inventive concept.

Referring to FIG. 10, a semiconductor device may include the controller 5, the plurality of memory chips 10T through 18T and 10B through 18B, and the bus B for electrically connecting components of the semiconductor device. The memory chips 10T through 18T may form the first memory chip group and may include the first memory chip 10T, the second memory chip 12T, the third memory chip 14T, the fourth memory chip 16T, and the fifth memory chip 18T that are sequentially arranged in a line on an upper surface of a substrate with respect to the controller 5. The memory chips 10B through 18B may form the second memory chip group and may include the first memory chip 10B, the second memory chip 12B, the third memory chip 14B, the fourth memory chip 16B, and the fifth memory chip 18B that are sequentially arranged in a line on a lower surface of the substrate with respect to the controller 5.

A data/address signal such as the command/address signal C/A may be transmitted to the memory chips 10T through 18T and 10B through 18B of the first and second memory chip groups, as described above with reference to FIGS. 3, 5, and 7.

FIG. 10 may represent a transmission of a strobe signal such as the clock signal CLK to the memory chips 10T through 18T and 10B through 18B of the first and second memory chip groups. The bus B for transmitting the clock signal CLK output from the controller 5 may include the first bus B1 and the second bus B2 branched at the output node NO of the controller 5. The first bus B1 may include the first node group including the first node N1, the second node N2, the third node N3, the fourth node N4, the fifth node N5, and the end node NT. The second bus B2 may include the second node group including the first node N1', the second node N2', the third node N3', the fourth node N4', the fifth node N5', and the end node NT'.

The bus B for transmitting the clock signal CLK output from the controller 5 may transmit the clock signal CLK to the memory chips 10T through 18T of the first memory chip group and the memory chips 10B through 18B of the second memory chip group via the first bus B1 and the second bus B2, respectively.

The first bus B1 may transmit the clock signal CLK to the memory chips 10T through 18T of the first memory chip group via the first through fifth nodes N1 through N5 of the first node group. The second bus B2 may transmit the clock signal CLK to the memory chips 10B through 18B of the second memory chip group via the first through fifth nodes N1' through N5' of the second node group.

After the first bus B1 supplies an electrical signal to the first memory chip 10T of the first memory chip group at the first node N1 of the first node group, the first bus B1 may supply the electrical signal to the fifth memory chip 18T of the first memory chip group at the second node N2 of the first node group before supplying the electrical signal to the second memory chip 12T of the first memory chip group at the fifth node N5 of the first node group. Additionally, after the second bus B2 supplies the electrical signal to the first memory chip 10B of the second memory chip group at the first node N1' of the second node group, the second bus B2 may supply the electrical signal to the fifth memory chip 18B of the second memory chip group at the second node N2' of the second node group before supplying the electrical signal to the second memory chip 12B of the second memory chip group at the fifth node N5' of the second node group.

The bus length L2 between the first node N1 and the second node N2 of the first node group may be greater than the bus length L3 between the second node N2 and the third node N3 of the first node group. The bus length L2 may be greater than the bus length L4 between the third node N3 and the fourth node N4 of the first node group or the bus length L5 between the fourth node N4 and the fifth node N5 of the first node group.

Likewise, a bus length L2' between the first node N1' and the second node N2' of the second node group may be greater than a bus length L3' between the second node N2' and the third node N3' of the second node group, a bus length L4' between the third node N3' and the fourth node N4' of the second node group, or a bus length L5' between the fourth node N4' and the fifth node N5' of the second node group.

In this case, the first termination resistor Rt may be connected to the end node NT of the first bus B1 for transmitting the clock signal CLK, and the second termination resistor Rt' may be connected to the end node NT' of the second bus B2 for transmitting the clock signal CLK.

Thus, signal integrity of the clock signal CLK having a relatively high speed may be increased by reducing an instantaneous load on the clock signal CLK compared to an instantaneous load on the command/address signal C/A having a relatively low speed. Additionally, the order in which the bus B supplies the electrical signal to the memory chips 10T through 18T and 10B through 18B of the first and second memory chip groups differs from the order in which the memory chips 10T through 18T and 10B through 18B of the first and second memory chip groups are arranged in a line on the substrate, and thus, a ring-back margin may be secured and signal integrity may be increased while maintaining downsizing of the memory device or the storage device.

Figure 11:
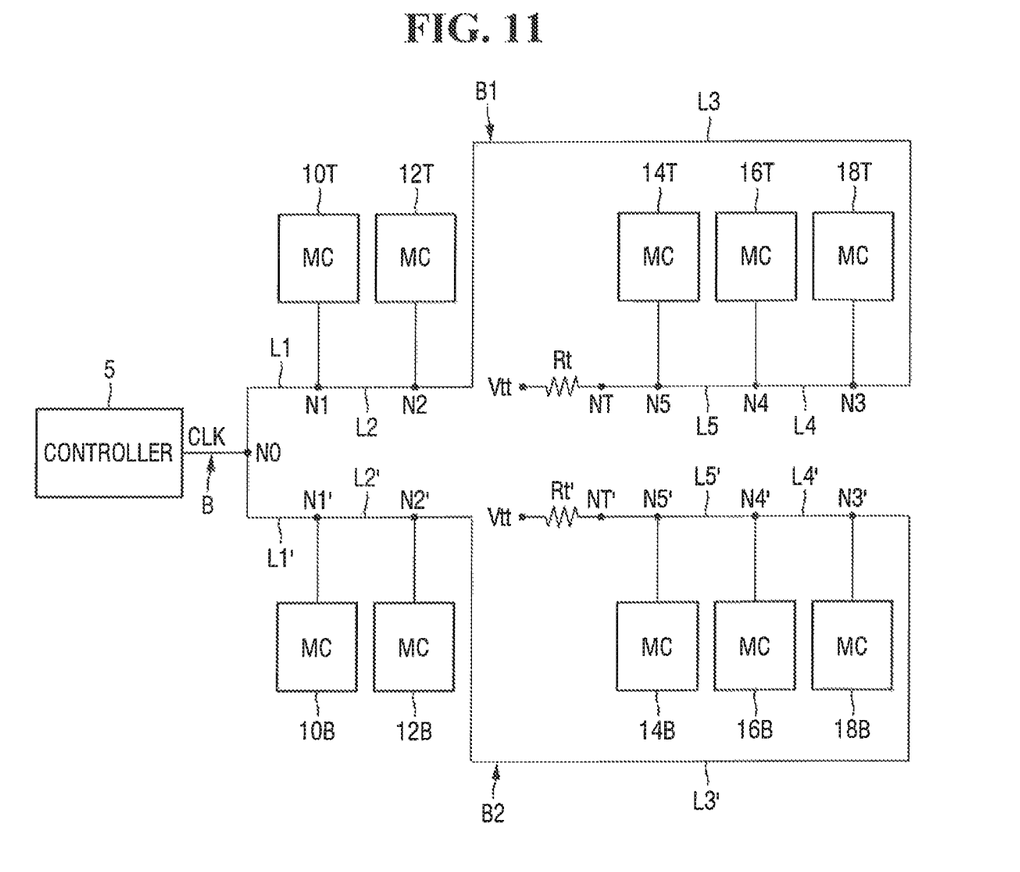
FIG. 11 is a block diagram illustrating a semiconductor device according to an exemplary embodiment of the inventive concept.

FIG. 11 is a block diagram illustrating a semiconductor device according to an exemplary embodiment of the inventive concept.

Referring to FIG. 11, a semiconductor device may include the controller 5, the plurality of memory chips 10T through 18T and 10B through 18B, and the bus B for electrically connecting components of the semiconductor device. The memory chips 10T through 18T may form the first memory chip group and may include the first memory chip 10T, the second memory chip 12T, the third memory chip 14T, the fourth memory chip 16T, and the fifth memory chip 18T that are sequentially arranged in a line on an upper surface of a substrate with respect to the controller 5. The memory chips 10B through 18B may form the second memory chip group and may include the first memory chip 10B, the second memory chip 12B, the third memory chip 14B, the fourth memory chip 16B, and the fifth memory chip 18B that are sequentially arranged in a line on a lower surface of the substrate with respect to the controller 5. The bus B may include the first bus B1 and the second bus B2 branched at the output node NO of the controller 5. The first bus B1 may include the first node group including the first node N1, the second node N2, the third node N3, the fourth node N4, the fifth node N5, and the end node NT. The second bus B2 may include the second node group including the first node N1', the second node N2', the third node N3', the fourth node N4', the fifth node N5', and the end node NT'.

A data/address signal such as the command/address signal C/A may be transmitted to the memory chips 10T through 18T and 10B through 18B of the first and second memory chip groups, as described above with reference to FIGS. 3, 5, and 7.

FIG. 11 may represent a transmission of a strobe signal such as the clock signal CLK to the memory chips 10T through 18T and 10B through 18B of the first and second memory chip groups.

Unlike FIG. 10, after the first bus B1 supplies an electrical signal to the first memory chip 10T and the second memory chip 12T of the first memory chip group at the first node N1 and the second node N2, respectively, of the first node group, the first bus B1 may supply the electrical signal to the fifth memory chip 18T of the first memory chip group at the third node N3 of the first node group before supplying the electrical signal to the third memory chip 14T of the first memory chip group at the fifth node N5 of the first node group. Additionally, after the second bus B2 supplies an electrical signal to the first memory chip 10B and the second memory chip 12B of the second memory chip group at the first node N1' and the second node N2', respectively, of the second node group, the second bus B1 may supply the electrical signal to the fifth memory chip 18B of the second memory chip group at the third node N3' of the second node group before supplying the electrical signal to the third memory chip 14B of the second memory chip group at the fifth node N5' of the second node group.

The bus length L3 between the second node N2 and the third node N3 of the first node group may be greater than the bus length L2 between the first node N1 and the second node N2 of the first node group. The bus length L3 may be greater than the bus length L4 between the third node N3 and the fourth node N4 of the first node group or the bus length L5 between the fourth node N4 and the fifth node N5 of the first node group.

Likewise, the bus length L3' between the second node N2' and the third node N3' of the second node group may be greater than the bus length L2' between the first node N1' and the second node N2' of the second node group, the bus length L4' between the third node N3' and the fourth node N4' of the second node group, or the bus length L5' between the fourth node N4' and the fifth node N5' of the second node group.

Thus, signal integrity of the clock signal CLK having a relatively high speed may be increased by reducing an instantaneous load on clock signal CLK compared to an instantaneous load on the command/address signal C/A having a relatively low speed. Additionally, the order in which the bus B supplies the electrical signal to the memory chips 10T through 18T and 10B through 18B of the first and second memory chip groups differs from the order in which the memory chips 10T through 18T and 10B through 18B of the first and second memory chip groups are arranged in a line on the substrate, and thus, a ring-back margin may be secured and signal integrity may be increased while maintaining downsizing of the memory device or the storage device.

Figure 12:
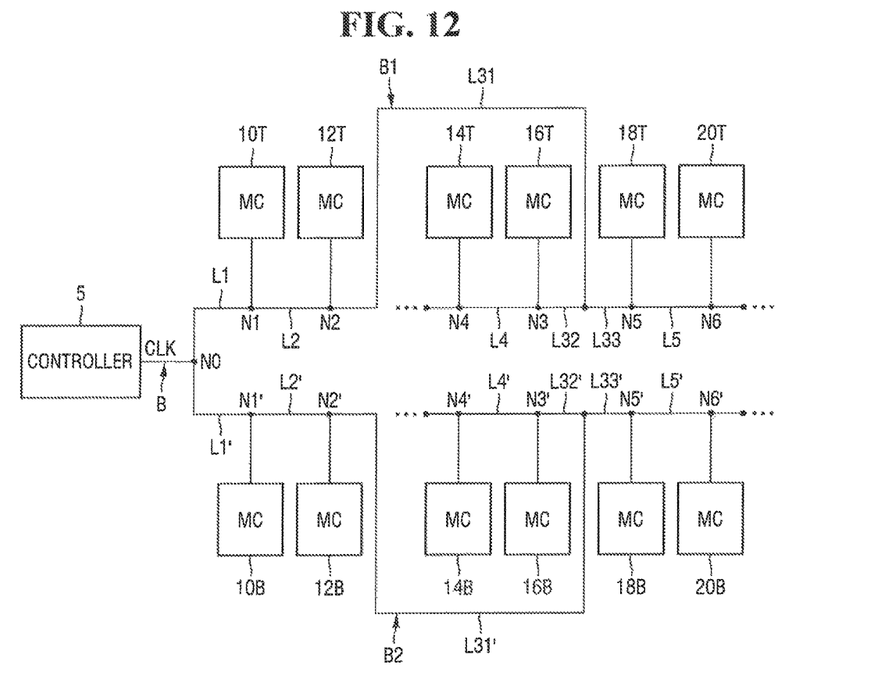
FIG. 12 is a block diagram illustrating a semiconductor device according to an exemplary embodiment of the inventive concept.

FIG. 12 is a block diagram illustrating a semiconductor device according to an exemplary embodiment of the inventive concept.

Referring to FIG. 12, a semiconductor device may include the controller 5, the plurality of memory chips 10T through 20T and 10B through 20B, and the bus B for electrically connecting components of the semiconductor device. The memory chips 10T through 20T may form the first memory chip group and may include the first memory chip 10T, the second memory chip 12T, the third memory chip 14T, the fourth memory chip 16T, the fifth memory chip 18T, and the sixth memory chip 20T that are sequentially arranged in a line on an upper surface of a substrate with respect to the controller 5. The memory chips 10B through 18B may form the second memory chip group and may include the first memory chip 10B, the second memory chip 12B, the third memory chip 14B, the fourth memory chip 16B, the fifth memory chip 18B, and the sixth memory chip 20B that are sequentially arranged in a line on a lower surface of the substrate with respect to the controller 5. The bus B may include the first bus B1 and the second bus B2 branched at the output node NO of the controller 5. The first bus B1 may include the first node group including the first node N1, the second node N2, the third node N3, the fourth node N4, the fifth node N5, and the sixth node N6. The second bus B2 may include the second node group including the first node N1', the second node N2', the third node N3', the fourth node N4', the fifth node N5', and the sixth node N6'.

A data/address signal such as the command/address signal C/A may be transmitted to the memory chips 10T through 20T and 10B through 20B of the first and second memory chip groups, as described above with reference to FIGS. 3, 5, and 7.

FIG. 12 may represent a transmission of a strobe signal such as the clock signal CLK to the memory chips 10T through 20T and 10B through 20B of the first and second memory chip groups.

After the first bus B1 supplies an electrical signal to the first memory chip 10T and the second memory chip 12T of the first memory chip group at the first node N1 and the second node N2, respectively, of the first node group, the first bus B1 may supply the electrical signal to the fourth memory chip 16T and the fifth memory chip 18T at the third node N3 and the fifth node N5, respectively, before supplying the electrical signal to the third memory chip 14T and the sixth memory chip 20T at the fourth node N4 and the sixth node N6, respectively. Additionally, after the second bus B2 supplies an electrical signal to the first memory chip 10B and the second memory chip 12B of the second memory chip group at the first node N1' and the second node N2', respectively, of the second node group, the second bus B2 may supply the electrical signal to the fourth memory chip 16B and the fifth memory chip 18B at the third node N3' and the fifth node N5', respectively, before supplying the electrical signal to the third memory chip 14B and the sixth memory chip 20B at the fourth node N4' and the sixth node N6', respectively.

A sum of a bus length L31 and a bus length L32, which is the bus length between the second node N2 and the third node N3, may be greater than the bus length L2 between the first node N1 and the second node N2 or the bus length L4 between the third node N3 and the fourth node N4. A sum of the bus length L31 and the bus length L33, which is the bus length between the second node N2 and the fifth node N5, may be greater than the bus length L2 or the bus length L5 between the fifth node N5 and the sixth node N6.

Likewise, a sum of a bus length L31' and a bus length L32', which is the bus length between the second node N2' and the third node N3' may be greater than the bus length L2' between the first node N1' and the second node N2' or the bus length L4' between the third node N3' and the fourth node N4'. A sum of the bus length L31' and a bus length L33', which is the bus length between the second node N2' and the fifth node N5', may be greater than the bus length L2' or the bus length L5' between the fifth node N5' and the sixth node N6'.

Thus, signal integrity of the clock signal CLK having a relatively high speed may be increased by reducing an instantaneous load on the clock signal CLK compared to an instantaneous load on the command/address signal C/A having a relatively low speed. Additionally, the order in which the bus B supplies the electrical signal to the memory chips 10T through 20T and 10B through 20B of the first and second memory chip groups differs from the order in which the memory chips 10T through 20T and 10B through 20B are arranged in a line on the substrate, and thus, a ring-back margin may be secured and signal integrity may be increased while maintaining downsizing of the memory device or the storage device.

While the inventive concept has been shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A semiconductor device comprising:
a plurality of memory chips arranged in a line on a substrate;
a bus connected to the plurality of memory chips, wherein the bus is configured to sequentially supply an electrical signal to the plurality of memory chips in accordance with a fly-by topology; and
a controller on the substrate,
wherein an order in which the electrical signal is supplied to the plurality of memory chips is different from an order in which the plurality of memory chips are arranged in the line on the substrate,
the plurality of memory chips include a first memory chip, a second memory chip, and a third memory chip,
the second memory chip is disposed between the first memory chip and the third memory chip,
the electrical signal is transmitted from the controller, and
after supplying the electrical signal to the first memory chip, the bus is configured to supply the electrical signal to the third memory chip before supplying the electrical signal to the second memory chip.

2. The semiconductor device of claim 1, wherein the second memory chip is disposed adjacent to the third memory chip,
the bus includes a first node connected to the first memory chip, a second node connected to the third memory chip, and a third node connected to the second memory chip, and
a bus length between the first node and the second node is greater than a bus length between the second node and the third node.

3. The semiconductor device of claim 2, wherein the first memory chip is disposed at a first position that is closest to the controller relative to positions of other memory chips among the plurality of memory chips,
the third memory chip is placed at a second position that is furthest from the controller relative to the positions of other memory chips among the plurality of memory chips,
the bus includes an end node, and the second memory chip is connected to the end node of the bus.

4. The semiconductor device of claim 1, wherein the first memory chip, the second memory chip, and the third memory chip are sequentially arranged in a line on an upper surface of the substrate with respect to the controller,
the plurality of memory chips further include a fourth memory chip, a fifth memory chip, and a sixth memory chip that are sequentially arranged in a line on a lower surface of the substrate with respect to the controller,
the fourth memory chip, the fifth memory chip, and the sixth memory chip are disposed at positions corresponding to positions of the first memory chip, the second memory chip, and the third memory chip, respectively, and
after supplying the electrical signal to the first memory chip and the fourth memory chip, the bus is configured to supply the electrical signal to the third memory chip and the sixth memory chip before supplying the electrical signal to the second memory chip and the fifth memory chip.

5. The semiconductor device of claim 4, wherein the electrical signal includes a first electrical signal and a second electrical signal that is different from the first electrical signal, and
the bus includes a first bus branched for supplying the first electrical signal to the first memory chip, the second memory chip, and the third memory chip and includes a second bus branched for supplying the first electrical signal to the fourth memory chip, the fifth memory chip, and the sixth memory chip.

6. The semiconductor device of claim 5, wherein the first electrical signal includes a clock signal, and the second electrical signal includes a command/address signal.

7. The semiconductor device of claim 1, wherein the plurality of memory chips further include a fourth memory chip and a fifth memory chip,
the third memory chip is disposed between the second memory chip and the fourth memory chip,
the fourth memory chip is disposed between the third memory chip and the fifth memory chip, and
after supplying the electrical signal to the first memory chip, the bus is configured to supply the electrical signal to the fourth memory chip before supplying the electrical signal to the second memory chip.

8. The semiconductor device of claim 5, wherein the second memory chip is disposed adjacent to the third memory chip,
the bus includes a first node at which the first memory chip is connected to the bus, a second node at which the third memory chip is connected to the bus, and a third node at which the second memory chip is connected to the bus, and
a bus length between the first node and the second node is greater than a bus length between the second node and the third node.

9. The semiconductor device of claim 1, wherein the plurality of memory chips further include a fourth memory chip, a fifth memory chip, a sixth memory chip, a seventh memory chip, and an eighth memory chip,
the first memory chip, the second memory chip, the third memory chip, and the fourth memory chip are sequentially arranged in a line on an upper surface of the substrate with respect to the controller,
the fifth memory chip, the sixth memory chip, the seventh memory chip, and the eighth memory chip are sequentially arranged in a line on a lower surface of the substrate and are disposed at positions corresponding to positions of the first memory chip, the second memory chip, the third memory chip, and the fourth memory chip, respectively, and after supplying the electrical signal to the first memory chip and the fifth memory chip, the bus is configured to supply the electrical signal to the third memory chip, the fourth memory chip, the seventh memory chip, and the eighth memory chip before supplying the electrical signal to the second memory chip and the sixth memory chip.

10. The semiconductor device of claim 9, wherein the electrical signal includes a first electrical signal and a second electrical signal that is different from the first signal, and the bus includes:

a first bus configured to supply the first electrical signal to the first memory chip, the second memory chip, the third memory chip, and the fourth memory chip; and a second bus configured to supply the first electrical signal to the fifth memory chip, the sixth memory chip, the seventh memory chip, and the eighth memory chip.

11. The semiconductor device of claim 10, wherein the first electrical signal includes a clock signal, and the second electrical signal includes a command/address signal.

12. A semiconductor device comprising:

a first memory chip region including a plurality of first memory chips arranged in a line on a first surface of a substrate;

a second memory chip region including a plurality of second memory chips arranged in a line on a second surface of the substrate and disposed at positions corresponding to positions of the plurality of first memory chips; and a bus including a first bus and a second bus, wherein the first bus is configured to supply an electrical signal to the first memory chip region in accordance with a fly-by topology and the second bus is configured to supply the electrical signal to the second memory chip region in accordance with the fly-by topology, wherein in the first memory chip region and the second memory chip region, an order in which the electrical signal is supplied to the plurality of first memory chips and the plurality of second memory chips via the first bus and the second bus, respectively, is different from an order in which the plurality of first memory chips and the plurality of second memory chips are arranged in lines, in the first memory chip region, the plurality of first memory chips include a first memory chip, a second memory chip, and a third memory chip, wherein the second memory chip is disposed between the first memory chip and the third memory chip, and after supplying the electrical signal to the first memory chip, the first bus is configured to supply the electrical signal to the third memory chip before supplying the electrical signal to the second memory chip.

13. The semiconductor device of claim 12, wherein the electrical signal includes a first electrical signal and a second electrical signal that is different from the first electrical signal, and the first electrical signal is supplied via the first bus and the second bus that are different from each other, and the second electrical signal is supplied via the bus without branching.

14. A semiconductor device comprising:

a plurality of memory chips including a first memory chip, a second memory chip, and a third memory chip arranged in a line on a substrate in an order of the first memory chip, the second memory chip, and the third memory chip;

a bus including a first node at which the first memory chip is connected to the bus, a second node at which the third memory chip is connected to the bus, and a third node at which the second memory chip is connected to the bus, wherein the bus is configured to supply an electrical signal to the plurality of memory chips via the first node, the second node and the third node sequentially in accordance with a fly-by topology, wherein a first bus length between the first node and the second node is greater than a second bus length between the second node and the third node, the plurality of memory chips further include a fourth memory chip disposed adjacent to the third memory chip, the bus further includes a fourth node at which the fourth memory chip is connected to the bus and a fifth node at which the bus branches to the second node and the fourth node, and a third bus length between the first node and the fifth node is greater than a fourth bus length between the fourth node and the fifth node.

15. The semiconductor device of claim 14, further comprising a controller on the substrate, wherein the first memory chip is disposed at a first position that is closest to the controller relative to positions of the second memory chip and the third memory chip, and the third memory chip is placed at a second position that is furthest from the controller relative to the positions of the first memory chip and the second memory chip.

16. The semiconductor device of claim 14, wherein the fourth memory chip is disposed adjacent to the first memory chip such that an arrangement order of the plurality of memory chips is the fourth memory chip, the first memory chip, the second memory chip, and the third memory chip, and the first bus length is greater than a fifth bus length between the fourth node and the first node.

17. The semiconductor device of claim 14, wherein the bus further includes an end node to which a termination resistor is connected, and the second node is connected to the end node.

* * * * *